United States Patent
Gordon et al.

(10) Patent No.: US 7,115,343 B2
(45) Date of Patent: Oct. 3, 2006

(54) PLIANT SRAF FOR IMPROVED PERFORMANCE AND MANUFACTURABILITY

(75) Inventors: Ronald L. Gordon, Poughkeepsie, NY (US); Ioana C. Graur, Poughkeepsie, NY (US); Lars W. Liebmann, Poughquag, NY (US)

(73) Assignee: International Business Machines Corporation, Armonk, NY (US)

(*) Notice: Subject to any disclaimer, the term of this patent is extended or adjusted under 35 U.S.C. 154(b) by 11 days.

(21) Appl. No.: 10/708,535

(22) Filed: Mar. 10, 2004

(65) Prior Publication Data

US 2005/0202321 A1    Sep. 15, 2005

(51) Int. Cl.
*G03F 9/00* (2006.01)
*G06F 17/50* (2006.01)

(52) U.S. Cl. ............... 430/5; 430/30; 716/2; 716/5; 716/8; 716/11; 716/19; 716/21

(58) Field of Classification Search ............... 430/30, 430/5; 716/19, 2, 5, 11, 8, 21
See application file for complete search history.

(56) References Cited

U.S. PATENT DOCUMENTS

| | | | |
|---|---|---|---|
| 5,958,635 A | * | 9/1999 | Reich et al. .................. 430/30 |
| 6,303,253 B1 | * | 10/2001 | Lu .................................. 430/5 |
| 2002/0026626 A1 | | 2/2002 | Randall et al. |
| 2002/0091985 A1 | | 7/2002 | Liebmann et al. |
| 2002/0091986 A1 | | 7/2002 | Ferguson et al. |
| 2002/0155357 A1 | * | 10/2002 | LaCour ............................ 430/5 |
| 2002/0166103 A1 | | 11/2002 | Rittman et al. |
| 2002/0192575 A1 | | 12/2002 | Stanton |
| 2003/0014731 A1 | | 1/2003 | LaCour |

FOREIGN PATENT DOCUMENTS

JP          11174659 A          7/1999

* cited by examiner

*Primary Examiner*—Christopher G. Young
(74) *Attorney, Agent, or Firm*—Todd M.C. Li; Hoffman, Warnick & D'Alessandro LLC

(57) ABSTRACT

A method for increasing coverage of subresolution assist features (SRAFs) in a layout. A set of possible SRAF placement and sizing rules for a given pitch is provided, ranked according to some figure of merit. During SRAF placement, the fit of a plurality of different SRAF solutions is successively evaluated to find the SRAF solution, or combinations thereof, which most improves lithographic performance while avoiding manufacturability problems. In general, the method comprises: obtaining a plurality of SRAF configurations for the layout; ranking the SRAF configurations based on a figure of merit; applying a highest ranked SRAF configuration to the layout; applying a predetermined number of lower ranked SRAF configurations to the layout; and selecting SRAF features from at least one of the applied SRAF configurations to provide the optimal SRAF configuration for the layout.

17 Claims, 11 Drawing Sheets

| #A | Pitch | Line Bias | Assist Width | Loc1 |
|---|---|---|---|---|
| 0 | 0.325 | 0.1625 | 0 | 0 |
| 0 | 0.3375 | 0.16875 | 0 | 0 |
| 0 | 0.35 | 0.175 | 0 | 0 |
|  |  |  |  |  |
| 1 | 0.5 | 0.15625 | 0.059375 | 0 |
| 1 | 0.5125 | 0.1625 | 0.059375 | 0 |
| 1 | 0.525 | 0.16875 | 0.0625 | 0 |
|  |  |  |  |  |
| 2 | 0.7 | 0.14375 | 0.05 | 0.1375 |
| 2 | 0.7125 | 0.14375 | 0.05625 | 0.13437 |
| 2 | 0.725 | 0.15 | 0.05625 | 0.1375 |

| Assist Width | Loc1 | PW Area (% $\mu$m) | PWareaRank |
|---|---|---|---|
| 0.05 | 0.15625 | 10.1708 | 2 |
| 0.05 | 0.159375 | 10.2137 | 3 |
| 0.053125 | 0.15625 | 10.1838 | 4 |
| 0.053125 | 0.159375 | 10.2267 | 5 |
| 0.05625 | 0.153125 | 10.1538 | 6 |
| 0.05625 | 0.15625 | 10.1967 | 7 |
| 0.05625 | 0.159375 | 10.2396 | 8 |
| 0.0625 | 0.159375 | 10.1733 | 9 |

| Pitch | #A | Assist Width | Loc1 | PWareaRank |
|---|---|---|---|---|
| 0.7 | 2 | 0.059375 | 0.159375 | 1 |
|  | 2 | 0.05625 | 0.159375 | 2 |
|  | 2 | 0.053125 | 0.159375 | 3 |
|  | 2 | 0.05 | 0.159375 | 4 |
|  | 2 | 0.05625 | 0.15625 | 5 |
|  | 2 | 0.053125 | 0.15625 | 6 |
|  | 2 | 0.0625 | 0.159375 | 7 |
|  | 2 | 0.05 | 0.15625 | 8 |
|  | 2 | 0.05625 | 0.153125 | 9 |

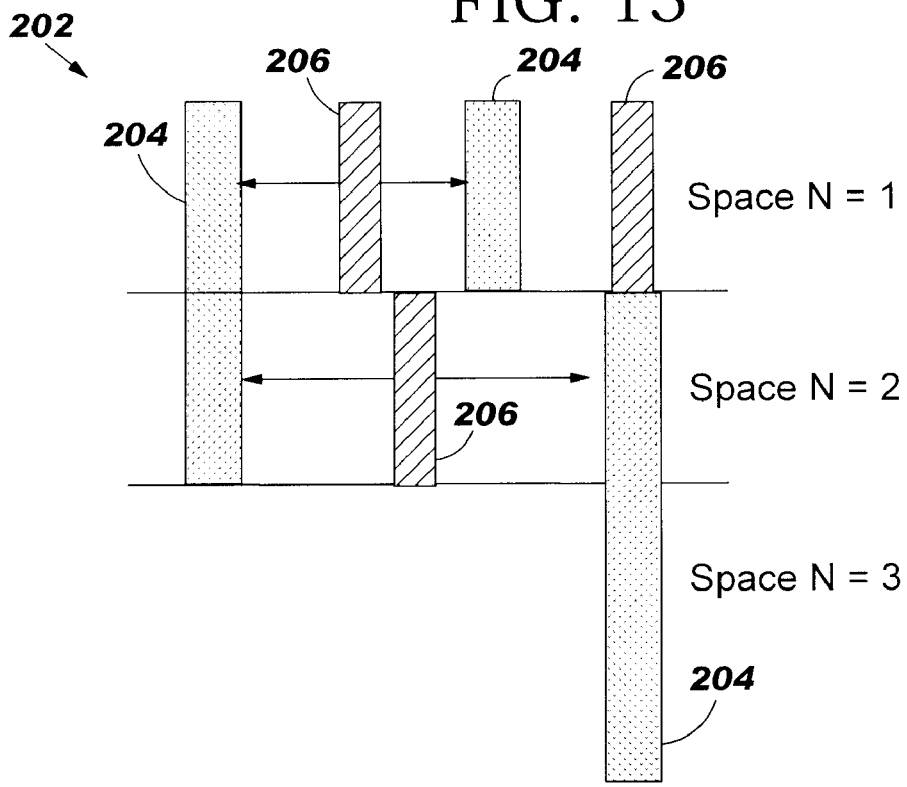
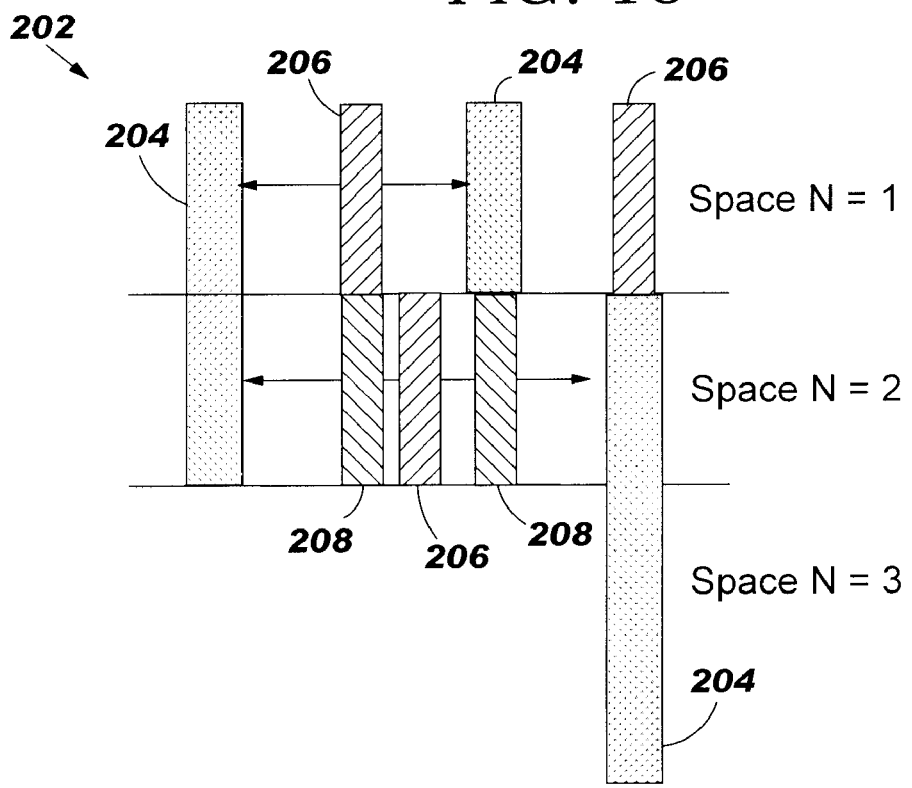

PLIANT SRAF FOR IMPROVED PERFORMANCE AND MANUFACTURABILITY

BACKGROUND OF INVENTION

The present invention relates in general to manufacturing processes that require lithography and, in particular, to methods of designing photomasks and optimizing lithographic and etch processes used in microelectronics manufacturing.

There is a continuing effort to reduce the dimensions of integrated circuit (IC) devices, and this has required greater precision in the tools used to manufacture IC devices. IC devices are designed using computer-aided design (CAD) or technology-computer-aided design (TCAD) layout tools which allow designers and manufacturers to plan the layout of circuits on a semiconductor wafer. The finished designs must be transferred to the wafer in a manner that allows device features to be produced by various processes of etching, depositing, implanting, and the like. This is done by applying a photoresist (also known as resist) layer to the surface of the wafer and then exposing the photoresist to radiation transmitted through a mask or reticle having patterns of transparent and opaque areas according to the feature or features to be formed on the wafer. The exposed photoresist is developed to provide openings in the photoresist layer through which the surface of the wafer is exposed for the process desired. This process of transferring the pattern to the wafer is generally referred to as photolithography. The finished product typically includes a number of patterned layers formed on the wafer, in which the patterns in different layers (or levels) are aligned to allow the formation of IC devices and circuit interconnection. Each patterned level or layer is typically formed using a separate mask or reticle layout pattern designed to form the desired pattern for that patterned level or layer.

The overall resolution of a photolithographic process refers to the minimum feature size (i.e., typically a critical dimension, or CD) that can be adequately printed, or "resolved," within specifications. This overall resolution limit depends on the resolution of the optical lithographic system, the properties of the resist as well as the subsequent etch processes. The resolution of the lithography (optical) system, that is, the ability to form a resolvable image pattern on the wafer, is critical to the overall process, and can be improved by resolution enhancement techniques (RETs), including modifications of the mask or reticle, as discussed in more detail below.

The resolution R of an optical lithography system is defined to be the smallest feature size of a grating that is resolvable as a function of illumination wavelength $\lambda$ and a numerical aperture NA, as expressed as $R=k_1\lambda/NA$, where $k_1$ is a process constant. For conventional optical lithography, the ultimate resolution limit is reached at $k_1=0.5$, the state at which only one set of diffracted orders can pass through the imaging optical system. Even as exposure wavelengths continue to decrease, and numerical apertures continue to increase, conventional optical lithography is still challenged by resolution below $k_1=0.5$. Approaching $k_1=0.5$ imposes formidable problems due to image quality degradation associated with the loss of increasing numbers of diffracted orders.

At low $k_1$ imaging, significant modifications to mask designs are required to print features in the desired fashion on the wafer. Due to the extreme sensitivity of many of these features to errors on the mask, in the stepper lens or in the lithography process (e.g., focus and dose), it is critical that these mask design modifications, or resolution enhancement techniques (RETs), be done properly. Resolution enhancement techniques such as optical proximity correction (OPC), subresolution assist feature enhancement (SRAF) lithography and phase-shifted-mask-enhanced (PSM) lithography have become increasingly important as resolution has increased beyond the quarter-micron level. In addition, RETs have been combined with the use of off-axis illumination (OAI) and advanced resist processing to bring the $k_1$ value closer to 0.25.

Off-axis illumination (OAI) provides resolution enhancement by modifying the illumination direction incident on the mask so as to eliminate or reduce on-axis illumination. For on-axis (i.e., propagation along the optical axis) light incident on a grating having pitch P, the $m^{th}$ diffracted order will propagate at an angle $\square_m=\sin^{-1}(m\lambda/P)$. However, only non-zero diffracted orders contain information about the grating, so at least one non-zero order must be collected in order to form an image. In other words, the projection lens must be large enough to collect at least the first order diffracted beams as well as the zero order beam. For the case of on-axis illumination, the first order diffracted beams m=−1 and m=+1 will propagate at angles $\square_m=\sin^{-1}(\lambda/P)$ relative to the optical axis, and thus the smallest pitch will be limited by the ability of the optical system to collect at least 3 beams (i.e., m=−1, 0, and +1), that is, a projection lens capable of collecting orders subtending an angle $2\square_1$. For a grating having equal lines and spaces having pitch P and line widths (CD) equal to P/2, the minimum feature size resolvable by such a lithographic system is $d=0.5\square/NA$, where $\sin(\square_1)=NA$, and thus $k_1=0.5$ as discussed above.

FIG. 1 schematically illustrates an optical projection lithographic system 10 in which illumination light (actinic energy) is provided through the aperture of pupil 12, and collected by a condenser lens 14. An illumination beam 16 is directed to a mask or reticle 18. The light is diffracted by the mask 18, creating diffracted orders m=0, ±1, ±2, ..., which are then collected by a projection lens 20, and projected to the wafer 22. In the case of off-axis illumination (OAI), the zeroth order beam will propagate undiffracted at an angle $\square_0$ from the optical axis 24, but only one of the +1 or −1 diffracted orders, propagating at angle $\square_1$, need be collected in order to form an image on the wafer 22. Thus, OAI provides resolution enhancement because the angle collected by the lithographic system will allow a correspondingly smaller grating pitch P to be used. The angle of propagation can be optimized for a primary or target pitch. In addition, if the angle of off-axis illumination is chosen so that zero order and one of the first orders are at the same distance from the center of the pupil of the projection lens 20, the relative phase difference between the zeroth order and that first order will be zero, making the image less subject to defocus, and thus increasing the depth of focus (DOF) for an associated pitch.

The drawback of OAI is that pitches other than the primary pitch will print with degraded process windows. In addition, since there are no discrete diffracted orders for isolated lines, there is little improvement of resolution for isolated lines as compared to densely pitched lines and spaces. The use of sub-resolution assist features provides a means of recovering the process window for pitches that are not enhanced by OAI. By creating nonprinting (non-resolved or sub-resolution) supplementary patterns next to the primary patterns on the mask in such a way that the combined layout approximately reproduces the primary pitch, thus producing the required interference effects, the overall process window can be improved.

Sub-resolution assist features (SRAFs), also known as scattering bars or intensity leveling bars, that are incorporated in photomask layouts, can provide significant lithographic benefit (e.g., improved process window) in the imaging of very large scale integrated (VLSI) circuit patterns when used in conjunction with OAI (e.g., annular illumination). The reason for this is because the SRAFs are designed to optically mimic a dense pattern, but print an isolated one. Methods for selecting size and placement of SRAFs have been discussed in the prior art.

The rules for laying out SRAFs, however, are determined only for grating structures; that is, the sizes and relative placements of the SRAFs are applicable only to geometries consisting of simple lines and spaces (i.e., 1D geometry). Real layouts, however, are more complicated and consist of features that may have finite length, corners, or T-junctions (i.e., 2D geometry). As it is very difficult to enumerate all the possible combination of geometries that may occur in a real layout, SRAF placement rules are not currently derived specially for any of these cases. Instead, the simple rules corresponding to the 1D geometry are applied, and termination of the SRAFs are determined by intersections or manufacturing constraints; such constraints typically dictate the maximum distance between features to be placed on a photomask, the minimum length of features, etc. It is expected that many SRAFs will not meet these constraints; those that do not are typically discarded. Unfortunately, the "cleanup" of an SRAF design containing un-manufacturable SRAF solutions may negatively impact lithographic performance (e.g., reduce process window, reduce yield, etc.).

A layout 30 of features to be printed, including an example of a "raw" SRAF layout prior to cleanup, is illustrated in FIG. 2. In the layout 30, the solid features 32 represent the main features to be printed on a wafer, and the cross-hatched features 34 represent SRAFs. The layout 30 was generated strictly according to a rules table (prior art) with no cleanup. That is, the single "best" SRAF solution that optimized some figure of merit (e.g., process window area) was used to place the SRAFs.

An illustrative 1D SRAF rules table 36 is illustrated in FIG. 3. The SRAF rules table 36 includes columns 38, 40, 42, 44, and 46, labeled as "#A," "Pitch," "Line Bias," "Assist Width," and "Loc1," respectively. Here, "#A" refers to the number of assist features used per space (i.e., the distance between two adjacent main features), "pitch" refers to the distance between the center of neighboring main features, "line bias" refers to the width of a main feature on the mask, "assist width" refers to the width of an assist feature on the mask, and "Loc1" refers to the placement of the center of an assist feature relative to the center of a main feature. It is assumed for the purposes of this description that the reader has an understanding of SRAF rules table generation commensurate with one skilled in the art. Accordingly, a detailed description of how SRAF rules tables are provided is not presented herein. A description may be found, for example, in Patent Application Publication No. US 2002/0091985 A1 to Liebmann et al., published Jul. 11, 2002, entitled "Method to Determine Optical Proximity Correction and Assist Feature Rules which Account for Variations in Mask Dimensions," incorporated herein by reference.

FIG. 4 illustrates the layout 30 of FIG. 2 after cleanup of SRAF features that violate manufacturing criteria (e.g., minimum space between SRAFs and features, minimum SRAF length, etc.). Comparing the regions 48 and 50 in FIGS. 2 and 4, it can be seen that the SRAFs 34 on the left-hand side of FIG. 2 that have touching corners have been shortened to meet minimum spacing constraints, while the SRAFs 34 immediately above the three vertically-oriented features 32 on the right-hand side of FIG. 2 have been removed to meet minimum spacing constraints and minimum feature lengths. Note that, after deleting the violating SRAFs 34, a significant amount of SRAF coverage has been sacrificed. Those areas not covered may suffer a decreased process window and can potentially reduce yield.

The effect of discarding the SRAFs that violate the manufacturing constraints is clear: incorrect line bias and an increase in sensitivity to focus error. The former problem is corrected by a simple re-biasing of the line in order to produce the correct printed linewidth on the wafer for the given nominal exposure dose; this is accomplished by applying Model-Based OPC (MBOPC) and is well known in the art. The latter problem, however, is not easily correctable. Even though MBOPC will correct the linewidth near a missing SRAF at nominal exposure dose and in focus, the local behavior of the linewidth out of focus will change. Because such out-of-focus conditions can be reached simply through imaging on a non-flat surface (i.e., over topography defined by lower layers), the linewidth change through focus is an important consideration.

SUMMARY OF INVENTION

The present invention provides a method for increasing coverage of SRAFs in a given layout. In particular, the present invention provides a set of possible SRAF placement and sizing rules for a given pitch, ranked according to some figure of merit. The figure of merit may include, for example, process window (PW) area, mask error factor (MEF), depth of focus (DOF), percent coverage, etc., or combinations thereof. During SRAF placement, rather than using only the single "best" SRAF solution that optimizes the figure of merit (as is done in the prior art), the method of the present invention successively evaluates the fit of a plurality of different SRAF solutions to find the SRAF solution, or combination of SRAF solutions, which most improves lithographic performance while avoiding manufacturability problems, such as mask constraint violations.

A first aspect of the present invention is directed to a method for providing an optimal subresolution assist feature (SRAF) configuration for a layout including at least one main feature, comprising: providing a plurality of SRAF configurations for the layout; ranking the SRAF configurations based on a figure of merit; applying a highest ranked SRAF configuration to the layout; applying a predetermined number of lower ranked SRAF configurations to the layout; and selecting SRAF features from at least one of the applied SRAF configurations to provide an optimal SRAF configuration for the layout.

A second aspect of the present invention is directed to a method for providing an optimal subresolution assist feature (SRAF) configuration for a layout including at least one main feature, comprising: providing a plurality of SRAF configurations for the layout; ranking the SRAF configurations based on a figure of merit; applying a highest ranked SRAF configuration to a space in the layout; applying a predetermined number of lower ranked SRAF configurations to the space in the layout; and selecting SRAF features from at least one of the applied SRAF configurations to provide an optimal SRAF configuration for the space in the layout.

A third aspect of the present invention is directed to a method for providing an optimal subresolution assist feature (SRAF) configuration for a layout, comprising: dividing the layout into spaces; and applying SRAF rules to a space in the layout, wherein the SRAF rules take into account SRAF features in adjacent spaces of the layout.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIG. 6 illustrates a table of the SRAF configurations in FIG. 5 that provide a PW area that is greater than or equal to 0.99*PWmax.

FIG. 7 illustrates a pliant SRAF rules table in accordance with the present invention, with SRAF configurations ranked according to PW area.

FIGS. 13–18 illustrate an application of the method flow depicted in FIG. 12.

DETAILED DESCRIPTION

In the following description, numerous specific details may be set forth to provide a thorough understanding of the present invention. However, it will be obvious to those skilled in the art that the present invention may be practiced without such specific details. In other instances, well known features may have been shown in block diagram form in order not to obscure the present invention in unnecessary detail.

The present invention provides a method for increasing coverage of SRAFs in a given layout. In particular, the present invention provides a set of possible SRAF placement and sizing rules for a given pitch, ranked according to some figure of merit. The figure of merit may include, for example, process window (PW) area, mask error factor (MEF), depth of focus (DOF), percent coverage, etc., or combinations thereof. During SRAF placement, rather than using only the single "best" SRAF solution that optimizes the figure of merit (as is done in the prior art), the method of the present invention successively evaluates the fit of a plurality of different SRAF solutions to find the SRAF solution, or combination of SRAF solutions, which most improves lithographic performance while avoiding manufacturability problems, such as mask constraint violations.

Figure 3:
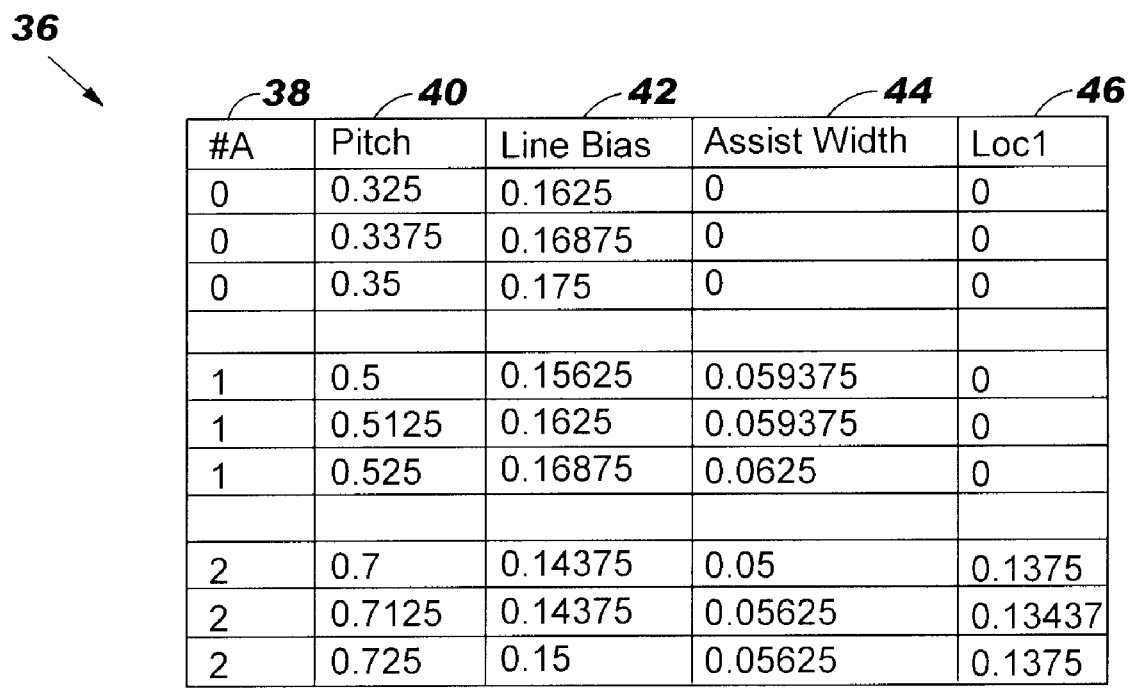
FIG. 3 depicts an illustrative 1D SRAF rules table in accordance with the prior art.

As mentioned above, an SRAF rules table (e.g., SRAF rules table 36, FIG. 3) specifies, for a given pitch, the number of assist features and the width and location of those assist features relative to a main feature. As known in the art, such a 1D SRAF rules table is typically generated experimentally from a very large set of structures that represent as dense a sample over parameter space as is practical. For example, referring to FIG. 5, there is presented an experimentally generated graph 100 illustrating the process window (PW) area provided by various SRAF configurations (#A=2) for a given pitch of 0.7 μm. The SRAF configurations were varied by adjusting the width of the assist features and the location (Loc1) of the assist features relative to a main feature (main line bias was also varied, but this is not necessary due to MBOPC.) It can be seen from the graph 100 that the optimum PW area 102 (PWmax=10.2526% μm) occurred using SRAF configuration#1056: assist width=0.059375 μm, Loc1=0.159375 μm. In accordance with the prior art, once this optimum PW area was obtained, all other information regarding the other SRAF configurations (real and interpolated) at the given pitch was typically discarded. In accordance with the present invention, however, this information is not discarded. Rather, as will be presented in greater detail below, the present invention employs this information to generate a pliant SRAF rules table.

Figure 5:
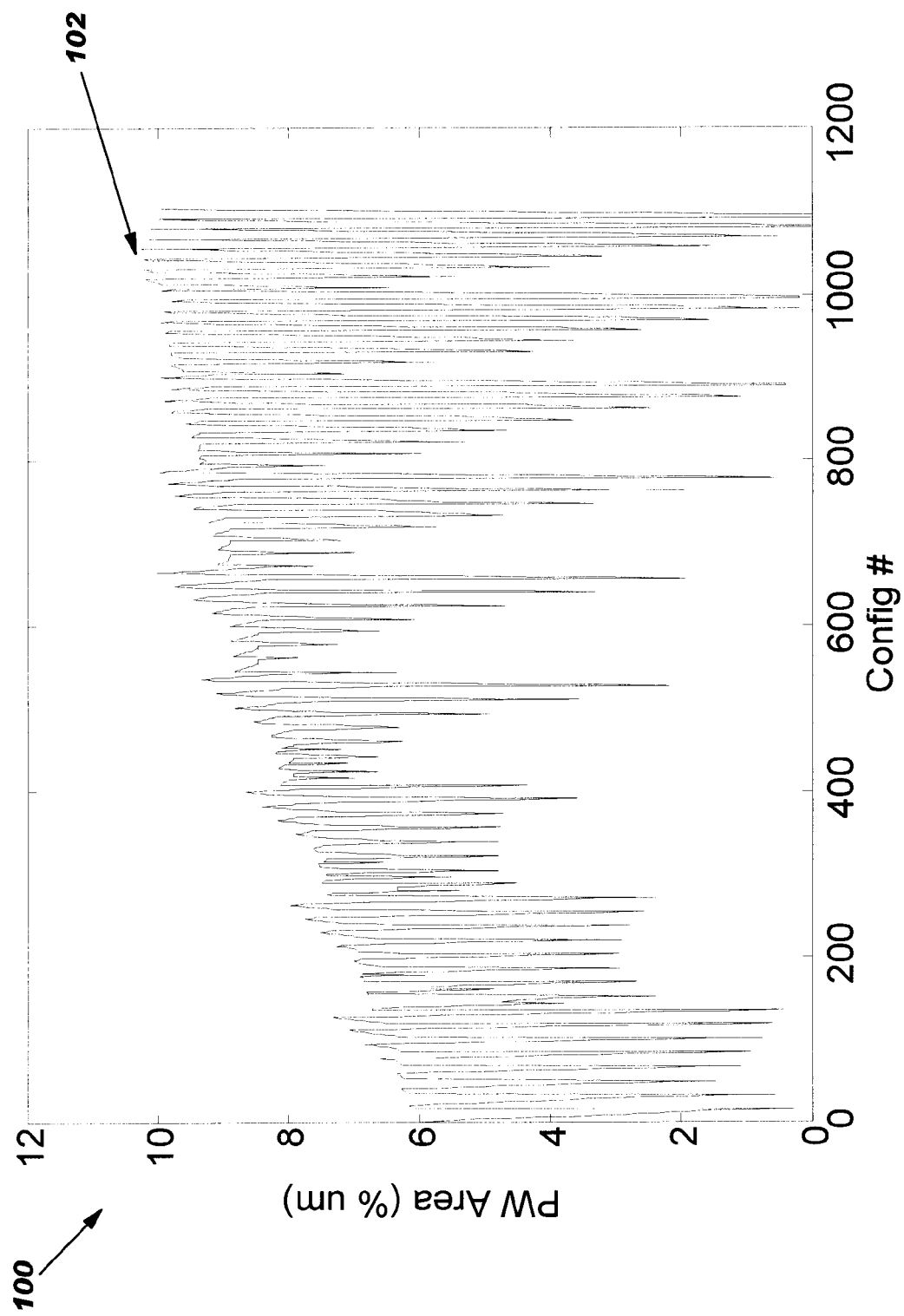
FIG. 5 illustrates an experimentally generated graph of process window (PW) area for a plurality of SRAF configurations (#A=2, pitch=0.7 μm).

As is evident by the graph 100 illustrated in FIG. 5, there may be many SRAF configurations having a PW area, or other figure of merit, which is within some small percentage (e.g., 1%) of the optimum value. Clearly, in these cases, it makes almost no difference which of these SRAF configurations is used in the SRAF rules table. The major differentiation between the SRAF configurations at this point is whether or not they will violate manufacturing rules or cause a conflict. To this extent, it is possible that some of these SRAF configurations may provide the same or better PW area (i.e., equal to or greater than PWmax) when used in a real manufacturing environment.

In the graph 100, there are eight SRAF configurations that provide a PW area that is greater than or equal to, for example, 0.99*PWmax. These SRAF configurations are listed in table 104 (FIG. 6), ranked in order of PW area. Using the information listed in table 104, a pliant SRAF rules table 106 can be obtained as illustrated in FIG. 7. As shown, the pliant SRAF rules table 106 lists nine possible SRAF configurations for a pair of assist features at a given pitch of 0.7 μm, ranked in order of PW area. Although shown as including nine possible SRAF configurations, it will be apparent to those skilled in the art that the pliant SRAF rules table 106 could include a lesser or greater number of SRAF configurations without departing from the teachings of the present invention.

Figure 1:
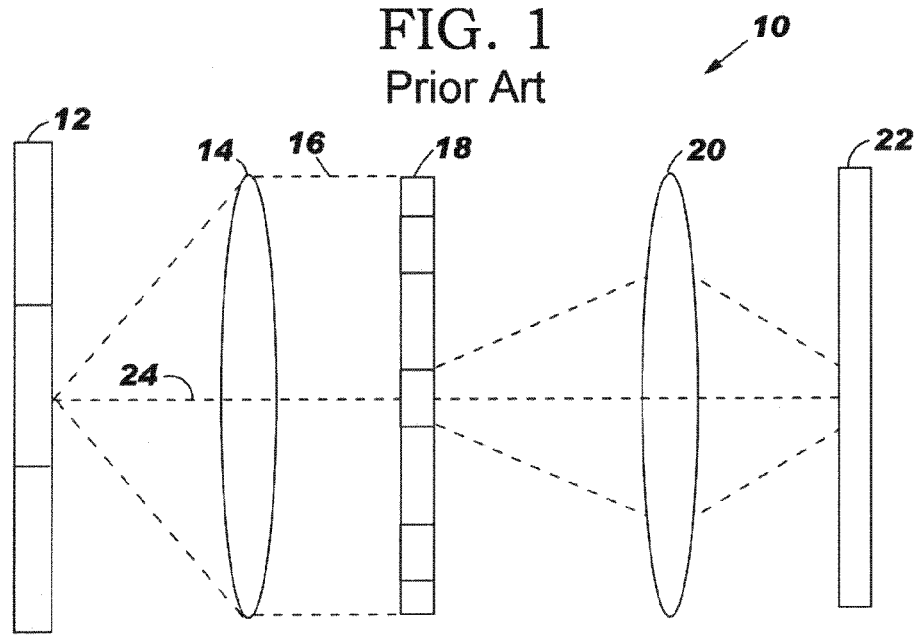
FIG. 1 illustrates a conventional optical projection lithographic system.
Figure 2:
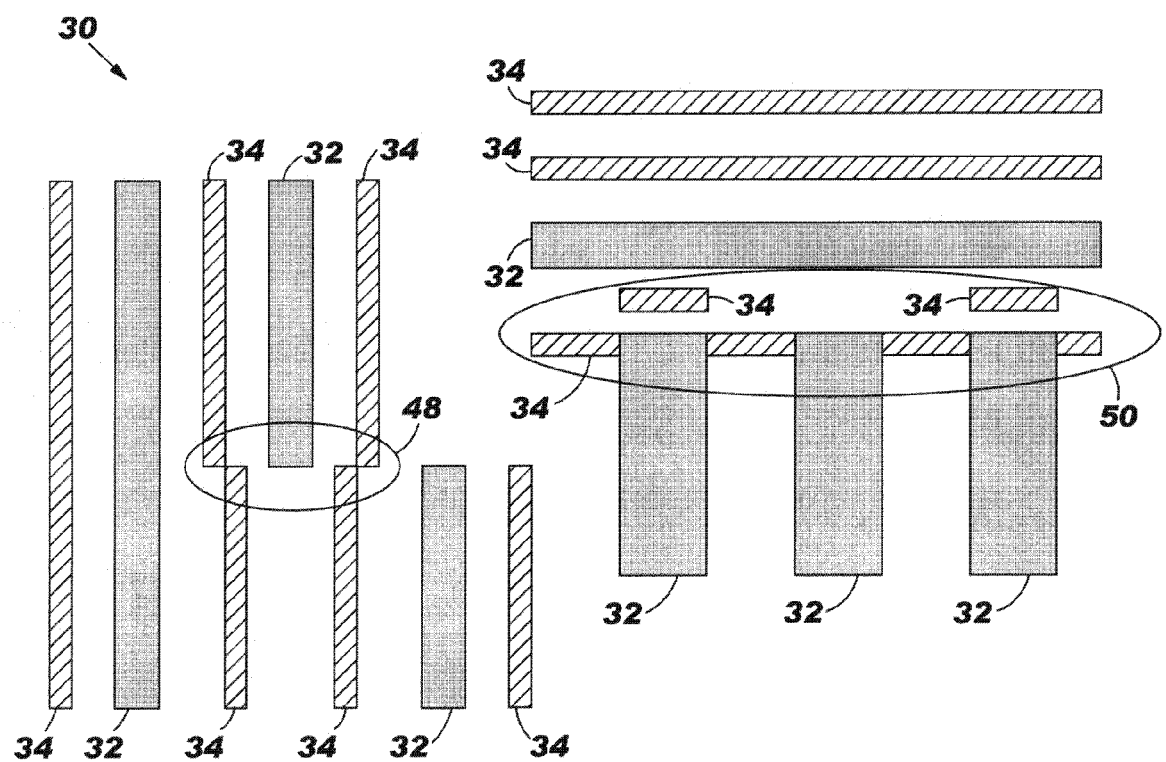
FIG. 2 illustrates a raw SRAF layout, prior to cleanup.
Figure 8:
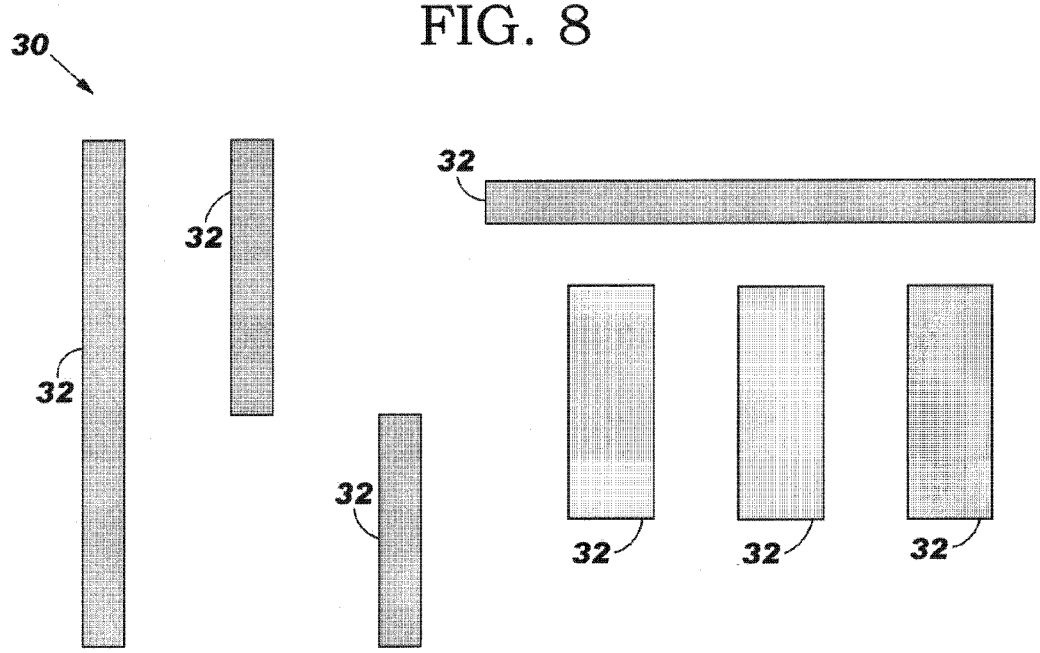
FIG. 8 illustrates a layout of features.
Figure 9:
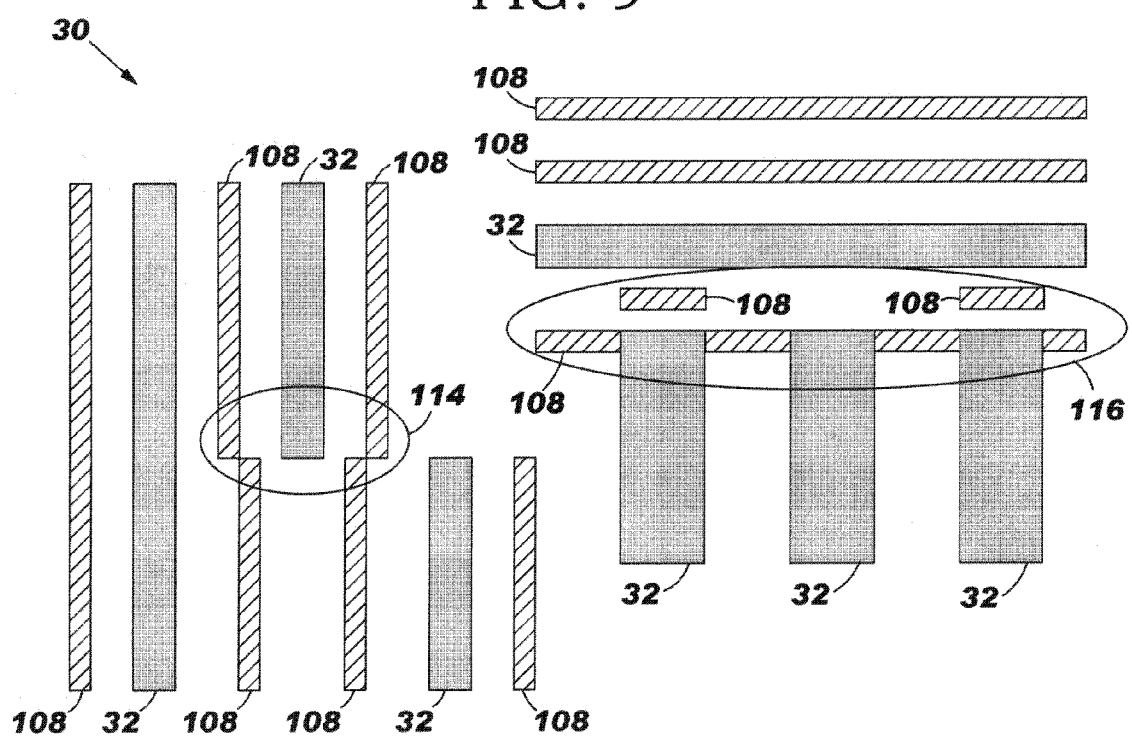
FIG. 9 illustrates the layout of FIG. 8 with a "rank 1" SRAF configuration placed thereon.

The placement of SRAFs in accordance with the present invention is illustrated with reference to FIGS. 8–11. FIG. 8 illustrates the layout 30 of features 32 initially presented with regard to FIG. 2, without any SRAFs placed therein. In FIG. 9, the SRAF configuration having the highest "rank" (i.e., "rank 1") in an associated pliant SRAF rules table is placed in the layout 30. As previously disclosed, the highest ranked SRAF configuration is the SRAF configuration that optimizes a figure of merit, such as PW area, when placed in the layout 30. In this example, the "rank 1" SRAF configuration comprises assist features 108, which are illustrated using a single cross-hatch in FIGS. 9–11. Note the "jaggedness" of the assist features in region 114, and the assist features in region 116 that do not meet minimum spacing constraints and/or minimum feature lengths.

The next highest ranked SRAF configuration (i.e., "rank 2") in the associated pliant SRAF rules table is subsequently placed in the layout 30. The "rank 2" SRAF configuration comprises assist features 110, which are illustrated using a double cross-hatch in FIGS. 10–11. This process can continue, if desired, using successively lower ranked SRAF configurations in the associated SRAF rules table. In general, all SRAF configurations above a predetermined "rank" in an SRAF rules table can be placed into a given layout. The number of SRAF configurations placed in a layout is application specific, and can therefore vary widely.

Figure 10:
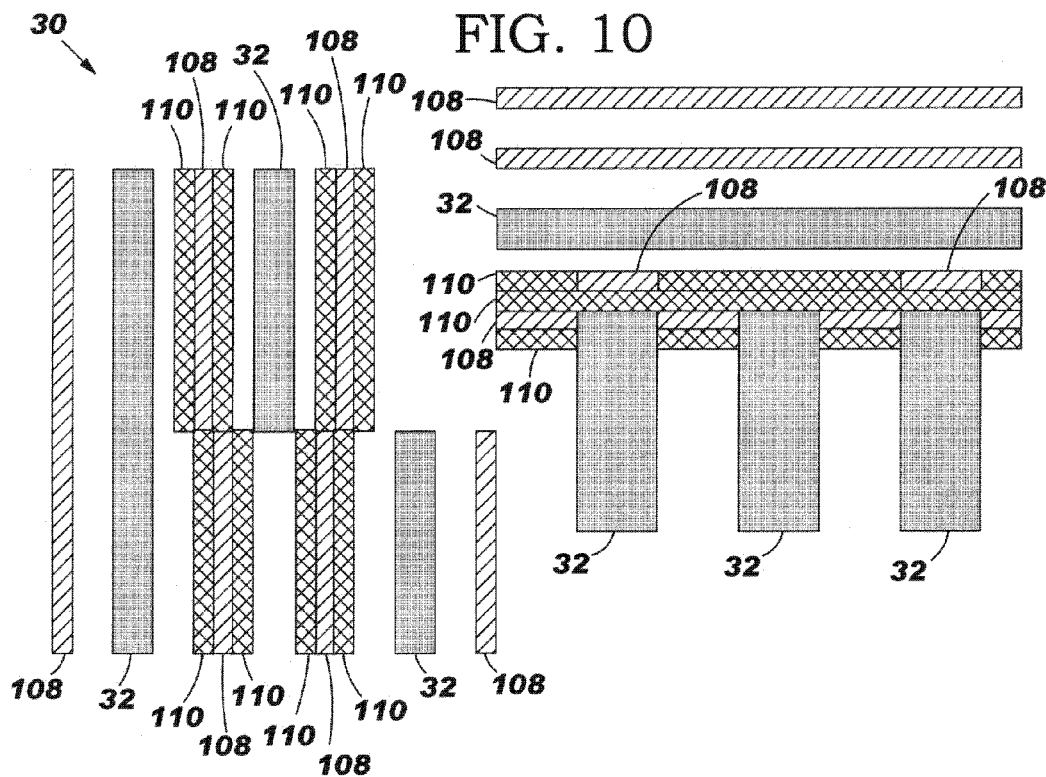
FIG. 10 illustrates the layout of FIG. 8 with "rank 1" and "rank 2" SRAF configurations placed thereon.
Figure 11:
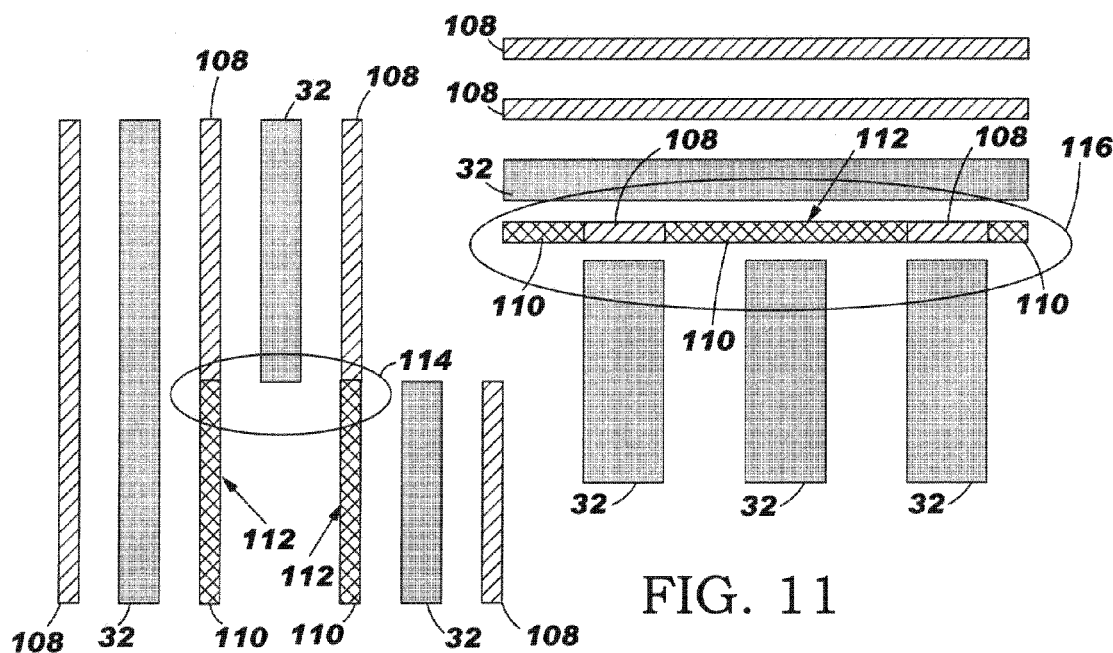
FIG. 11 illustrates an optimized SRAF configuration created by combining the "rank 1" and "rank 2" SRAF configurations depicted in FIG. 10.

Using the above process, an optimized SRAF configuration, comprising assist features from one or more differently ranked SRAF configurations, can be generated. This is done by selectively choosing/discarding assist features such that the SRAF coverage is maximized and SRAF rules and manufacturing constraints are satisfied. Such an optimized SRAF arrangement improves lithographic performance by increasing SRAF coverage, process window, yield, etc. An example of an optimized SRAF configuration, generated using the "rank 1" and "rank 2" assist features 108, 110 in FIG. 10, is illustrated in FIG. 11. As shown, the optimized SRAF configuration includes several assist features 112 that are formed by combining "rank 1" and "rank 2" assist features 108, 110. The remaining, unused assist features 108, 110 shown in FIG. 10 are removed from the layout. The process of choosing which assist features to keep or discard may be carried out in any suitable manner (e.g., using a design tool, etc.).

Figure 4:
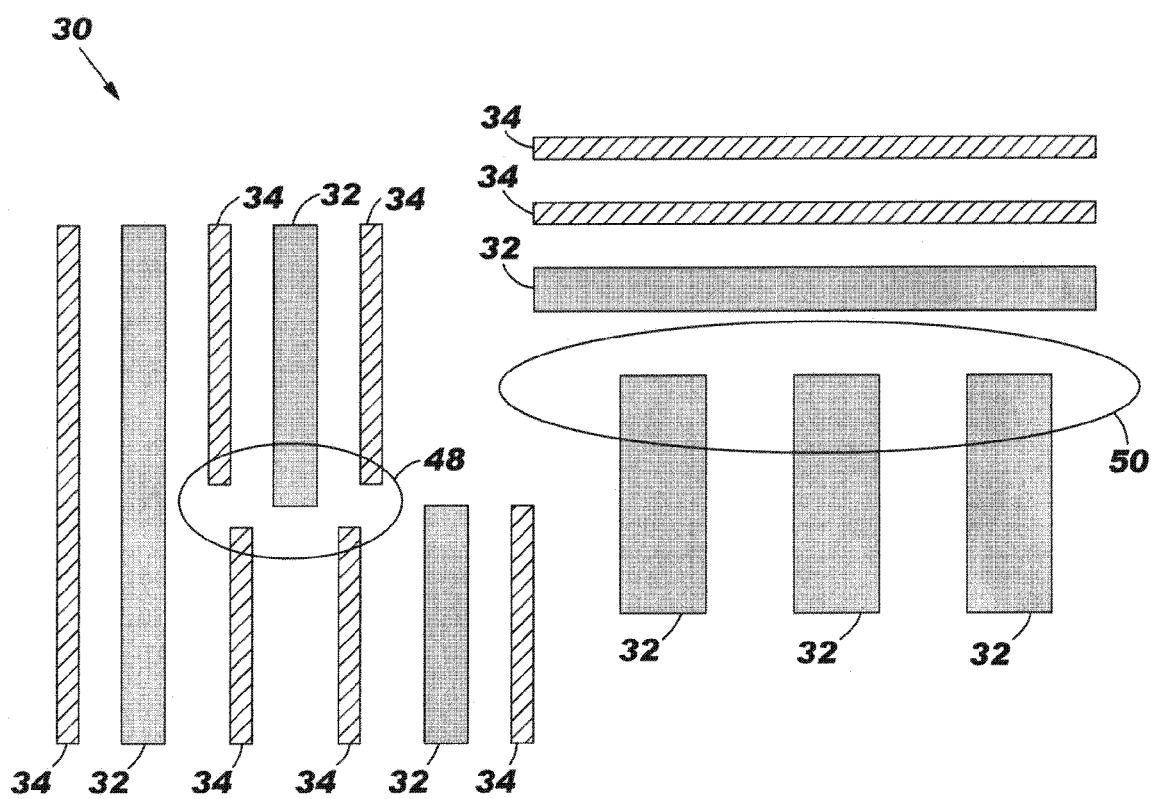
FIG. 4 illustrates the layout of FIG. 2 after cleanup of SRAF features that violate manufacturing criteria, in accordance with a method of the prior art.

Comparing the region 114 in FIGS. 9 and 11, it can be seen that the optimized SRAF configuration in FIG. 11, which combines assist features 108, 110 from the "rank 1" and "rank 2" SRAF configurations, is a "smoothed" version of the "rank 1" SRAF configuration illustrated in FIG. 9. (Note that the "rank 1" and "rank 2" rules applied here are not necessarily those shown in FIG. 7.) As such, further SRAF cleanup is not necessary in this example (compare to the cleanup previously required when using only the "rank 1" SRAF configuration (see FIG. 4)). Further, comparing the region 116 in FIGS. 9 and 11, it can be seen that minimum spacing constraints and minimum feature length requirements have been satisfied, and that the SRAF coverage has been increased.

Figure 12:
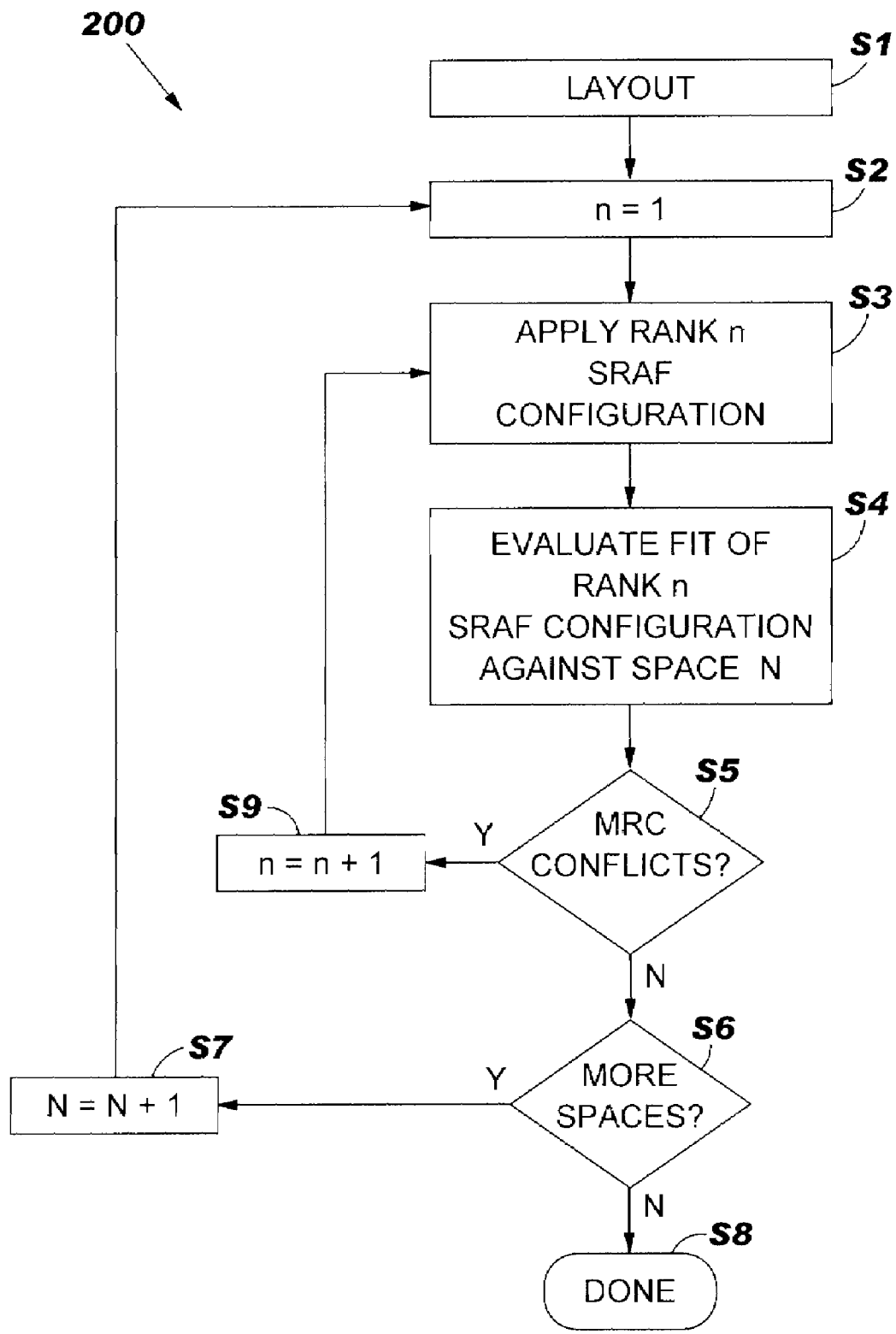
FIG. 12 illustrates a flow diagram illustrating one possible method flow in accordance with the present invention.

A flow diagram 200 illustrating one possible method flow in accordance with the present invention is illustrated in FIG. 12. A corresponding example depicting the method flow 200 is illustrated in FIGS. 13–18.

Figure 13:
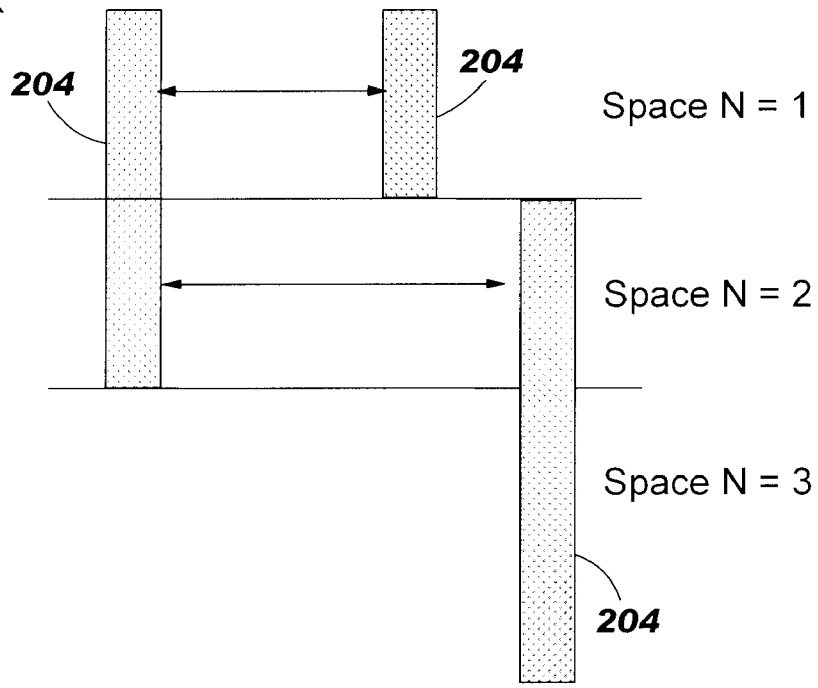
Figure 14:
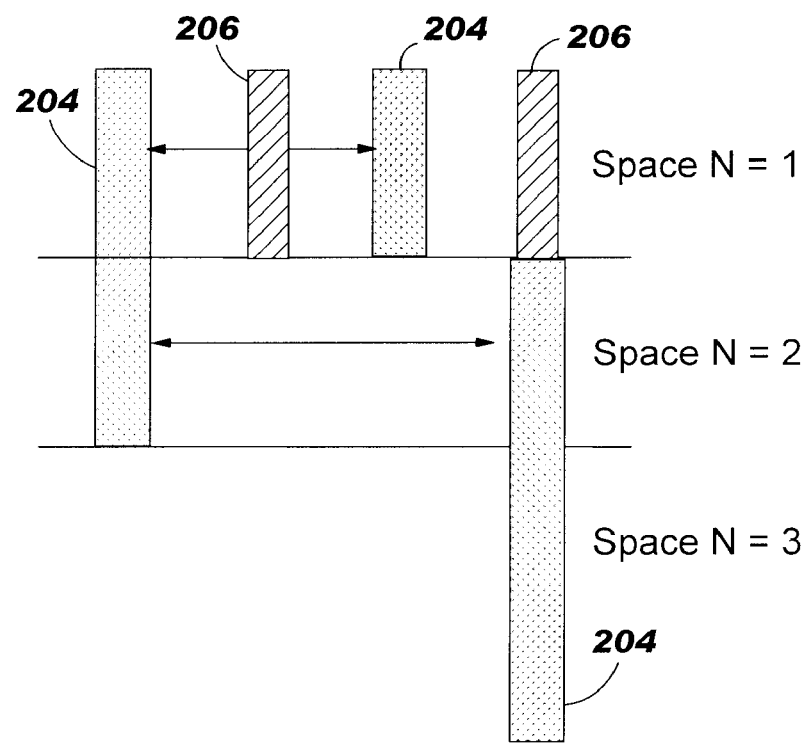

In step S1, a layout 202 of main features 204 is provided (see FIG. 13). In this example, the main features 204 are divided according to spacing into three spaces N, corresponding to a dense spacing (N=1), a semi-dense spacing (N=2), and an isolated feature (N=3). In step S2, the ranking of an SRAF configuration is set to "rank 1" (n=1). In step S3, the "rank 1" SRAF configuration, comprising assist features 206, is laid out on the layout 202 in space N=1 (see FIG. 14). In step S4, the fit of the "rank 1" (n=1) SRAF configuration is evaluated against space N=1. If manufacturing constraints (MRCs) are met (Step S5), and more spaces exist (Step S6), N is incremented by 1 (Step S7), and flow returns to Step S2. Else the method ends (Step S8). If the MRCs are not met (Step S5), n is incremented by 1 (Step S9), and the "rank 2" (n =2) SRAF configuration is applied to the space N=1. In this example, the MRCs are met for the "rank 1" (n=1) SRAF configuration in space N=1, N is increased to 2, and the "rank 1" (n=1) SRAF configuration is subsequently applied to space N=2 (see FIG. 15).

Figure 17:
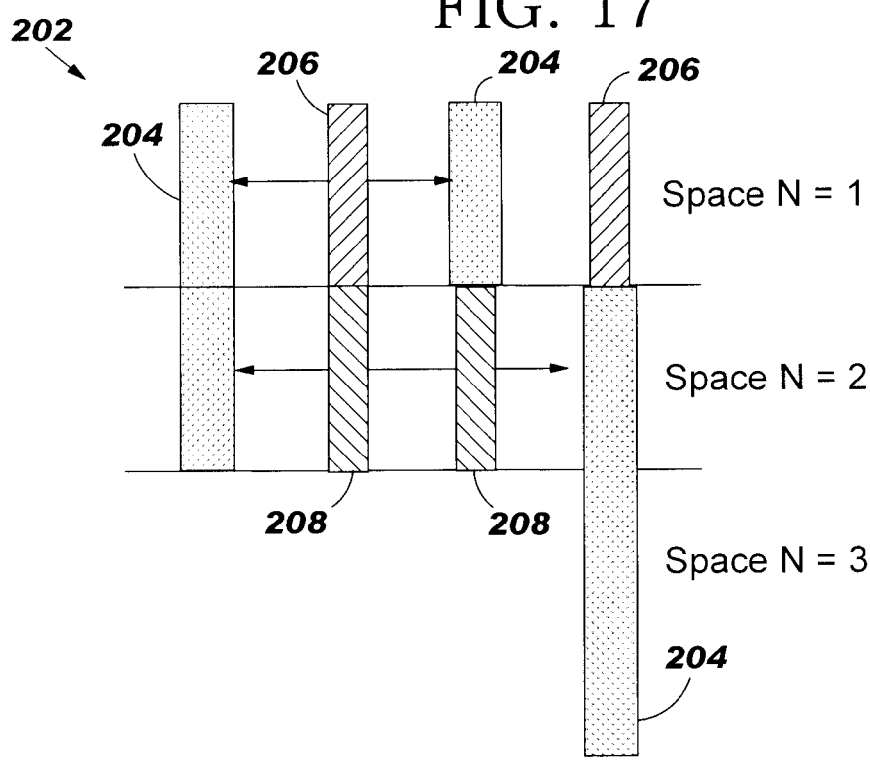
Figure 18:
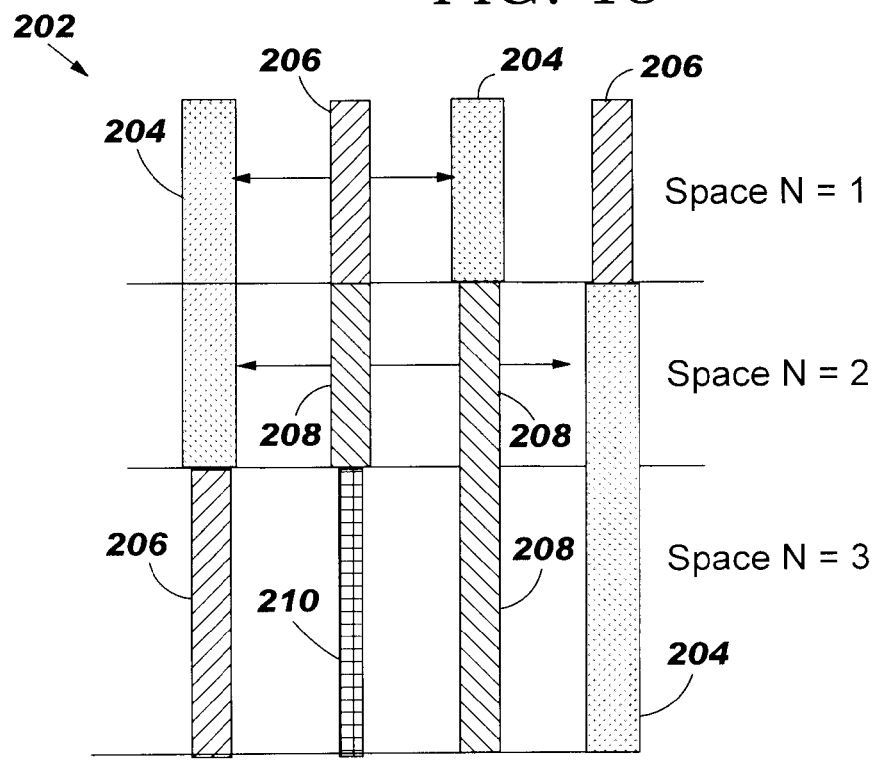

When the assist features 206 of the "rank 1" (n=1) SRAF configuration in spaces N=1 and N=2 are evaluated (Step S4), it is found that the MRCs are not met (Step S5). For example, the assist features 206 may not meet minimum spacing constraints. To this extent, n is increased to 2 (Step S9) and the "rank 2" (n=2) SRAF configuration, comprising assist features 208, is applied (Step S3) to space N=2 (see FIG. 16). Upon evaluation (Step S4) of the assist features 206, 208 in space N=2, it is determined that the assist features 208 optimize the overall SRAF configuration (MRCs are also met), and that the assist feature 206 in space N=2 can be discarded. The resultant layout is shown in FIG. 17. Since another space (i.e., N=3) exists, N is incremented by 1 to N=3 (Step S7), and flow returns to Step S2, where n is reset to 1. Processing continues until an optimized SRAF configuration is found for all spaces, or until all acceptable "ranked" SRAF configurations have been evaluated. A possible final SRAF configuration is shown in FIG. 18, wherein the assist features 210 belong to the "rank 3" (n=3) SRAF configuration.

From the flow diagram 200 illustrated in FIG. 12, and the corresponding example illustrated in FIGS. 13–18, it can be seen that this method provides for SRAF placement based on current space, prior space, and following space. To this extent, a three-dimensional SRAF rules table that specifies SRAF placement based on current space, prior space, and following space, can be provided. That is, the three-dimensional SRAF rules table would take into account not only the immediate SRAF feature, but would also take into account the features in the immediate neighborhood of that feature.

It is understood that the methods described herein can be implemented in hardware, software, or a combination of hardware and software. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for providing an optimal subresolution assist feature (SRAF) configuration for a layout including at least one main feature, comprising:
   providing a plurality of SRAF configurations for the layout;
   ranking the SRAF configurations based on a figure of merit, wherein the figure of merit is selected from the group consisting of process window area, mask error factor, depth of focus, percent coverage, and combinations thereof;
   applying a highest ranked SRAF configuration to the layout;
   applying a predetermined number of lower ranked SRAF configurations to the layout; and
   selecting SRAF features from at least one of the applied SRAF configurations to provide an optimal SRAF configuration for the layout.

2. The method of claim 1, wherein the optimal SRAF configuration optimizes lithographic performance while avoiding manufacturability problems.

3. The method of claim 1, wherein the figure of merit comprises process window (PW) area, wherein the highest ranked SRAF configuration has a PW equal to PWmax, and wherein the predetermined number of lower ranked SRAF configurations have a PW greater than or equal to a predetermined percentage of PWmax.

4. The method of claim 1, further comprising:
   discarding any SRAF features that are not selected.

5. The method of claim 1, further comprising:
   dividing the main features according to spacing into at least one space; and
   successively applying the method to each space.

6. A computer readable program product stored on a computer usable medium, comprising program means for performing the method according to claim 1.

7. A method for providing an optimal subresolution assist feature (SRAF) configuration for a layout including at least one main feature, comprising:
   providing a plurality of SRAF configurations for the layout;
   ranking the SRAF configurations based on a figure of merit, wherein the figure of merit is selected from the group consisting of process window area, mask error factor, depth of focus, percent coverage, and combinations thereof;
   applying a highest ranked SRAF configuration to a space in the layout;
   applying a predetermined number of lower ranked SRAF configurations to the space in the layout; and
   selecting SRAF features from at least one of the applied SRAF configurations to provide an optimal SRAF configuration for the space in the layout.

8. The method of claim 7, further comprising:
   repeating the applying and selecting steps for each additional space in the layout.

9. The method of claim 8, wherein, after applying the highest ranked SRAF configuration to a space in the layout:
   evaluating a fit of the highest ranked SRAF configuration;
   if the fit of the highest ranked SRAF configuration is acceptable, applying the highest ranked SRAF configuration to another space in the layout;
   if the fit of the highest ranked SRAF configuration is not acceptable, applying a lower ranked SRAF configuration to the space in the layout.

10. The method of claim 9, further comprising:
    evaluating a fit of the lower ranked SRAF configuration;
    if the fit of the lower ranked SRAF configuration is acceptable, applying the highest ranked SRAF configuration to another space in the layout;
    if the fit of the lower ranked SRAF configuration is not acceptable, applying another lower ranked SRAF configuration to the space in the layout.

11. The method of claim 7, wherein the optimal SRAF configuration optimizes lithographic performance while avoiding manufacturability problems.

12. The method of claim 7, wherein the figure of merit comprises process window (PW) area, wherein the highest ranked SRAF configuration has a PW equal to PWmax, and wherein the predetermined number of lower ranked SRAF configurations have a PW greater than or equal to a predetermined percentage of PWmax.

13. The method of claim 7, further comprising: discarding any SRAF features that are not selected.

14. A computer readable program product stored on a computer usable medium, comprising program means for performing the method according to claim 7.

15. A method for providing an optimal subresolution assist feature (SPAF) configuration for a layout, comprising:
    dividing the layout into spaces based on a density of SRAF features; and
    applying SRAF rules to a space in the layout, wherein the SRAF rules take into account SRAF features in adjacent spaces of the layout.

16. The method of claim 15, wherein the adjacent spaces comprise a prior space and a following space.

17. A computer readable program product stored on a computer usable medium, comprising program means for performing the method according to claim 15.

* * * * *